United States Patent [19]

White

[11] Patent Number: 5,221,639
[45] Date of Patent: Jun. 22, 1993

[54] METHOD OF FABRICATING RESISTIVE CONDUCTIVE PATTERNS ON ALUMINUM NITRIDE SUBSTRATES

[75] Inventor: Jerry L. White, Phoenix, Ariz.

[73] Assignee: Motorola, Inc., Schaumburg, Ill.

[21] Appl. No.: 811,272

[22] Filed: Oct. 20, 1991

[51] Int. Cl.⁵ .................. H01L 21/283; H01L 21/58
[52] U.S. Cl. ........................ 437/184; 437/60; 437/192; 437/918; 437/209
[58] Field of Search .............. 437/192, 190, 946, 184, 437/60, 918, 209; 174/256, 255; 148/DIG. 136, DIG. 113; 257/678, 684, 700, 711

[56] References Cited

U.S. PATENT DOCUMENTS

| | | | |
|---|---|---|---|
| 4,777,583 | 10/1988 | Minami et al. | 346/76 PH |
| 4,951,014 | 8/1990 | Wohlert et al. | 333/246 |
| 4,963,701 | 10/1990 | Yasumoto et al. | 174/256 |
| 5,018,004 | 5/1991 | Okinaga et al. | 357/74 |
| 5,028,306 | 7/1991 | Davis et al. | 204/192.15 |
| 5,041,700 | 8/1991 | Iyogi et al. | 174/255 |

FOREIGN PATENT DOCUMENTS 63-317357 12/1988 Japan .

*Primary Examiner*—T. N. Quach
*Attorney, Agent, or Firm*—Harry A. Wolin

[57] ABSTRACT

A method of fabricating a resistive conductive pattern on an aluminum nitride substrate includes forming a resistive chromium containing film on the aluminum nitride substrate and then forming a refractory metal layer on the resistive film. The resistive film and refractory metal layer are then patterned and one or more conductive layers may then be formed on the patterned refractory metal layer. Resistors may then be formed between conductive lines patterned from the layers. These resistors are formed from the resistive film.

25 Claims, 1 Drawing Sheet

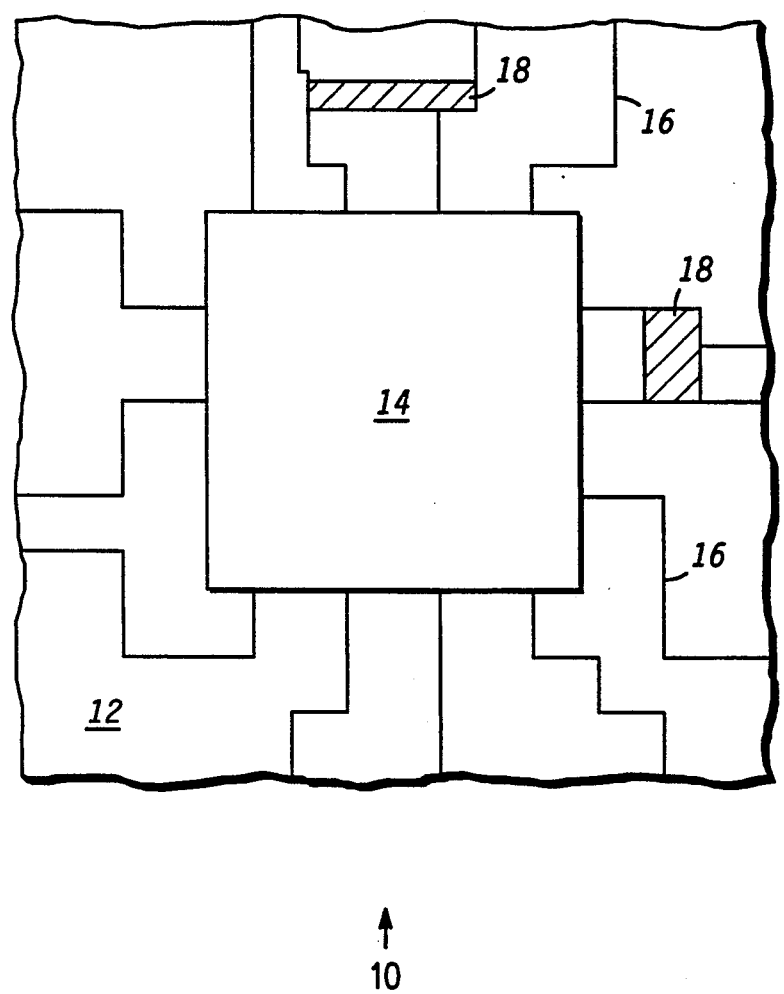

METHOD OF FABRICATING RESISTIVE CONDUCTIVE PATTERNS ON ALUMINUM NITRIDE SUBSTRATES

FIELD OF THE INVENTION

This invention relates, in general, to semiconductor devices and more particularly to a method fabricating conductive patterns on aluminum nitride substrates.

BACKGROUND OF THE INVENTION

High frequency semiconductor devices such as RF devices are well known in the art. Many high frequency packages employing such devices commonly include an insulating substrate on which the semiconductor is actually mounted. The insulating substrate often includes a conductive pattern therein to which the semiconductor die is electrically coupled, commonly by wire bonds.

Berylium oxide (BeO) is a well known ceramic material often employed as an insulating substrate in RF devices. Berylium oxide is desirable due to its great thermal conductivity properties. However, berylium oxide is very expensive and difficult to use. Further, berylium oxide is toxic in its powdered form and this toxicity has resulted in increased government regulation dealing with its use. RF packages employing ceramics such as berylium oxide are also relatively difficult to frequency match. The problems associated with berylium oxide have led those of skill in the art to look to other insulating materials to employ as substrates in high frequency devices.

Aluminum oxide ($Al_2O_3$) has been investigated as a substrate material for RF packages. Although aluminum oxide has many good properties, its thermal conductivity properties are poor and therefore it undesirable for various high frequency applications.

Aluminum nitride substrates have been used in the past. Historically, aluminum nitride substrates are employed with thick film processes. One such thick film process employs screening on a molybdenum/manganese film and then firing it for adhesion. This film typically has a thickness of greater than one mil. Once the molybdenum/manganese screen has been applied, a metallization scheme such as nickel/gold is formed on the molybdenum/manganese screen. The screen layer is necessary in the thick film process because aluminum nitride typically has very poor adhesion properties to metals. The necessity of this thick screen film is undesirable because it increases the size of the semiconductor package and leads to severe problems in electrical performance. Further, the molybdenum/manganese screen is not resistive and accordingly, no resistive properties can be derived therefrom.

Various thin film processes using aluminum nitride substrates have also been investigated. Once such thin film process includes sputtering a titanium or tungsten layer on an aluminum nitride substrate and then firing the film. Reactive sputtering of titanium or tungsten may also be employed. The reactive sputtering is typically performed in a controlled chamber so that the temperature and gases are such that a nitride is formed between the aluminum nitride substrate and the metal film. This nitride allows adhesion between the substrate and the film. A disadvantage with this method is that neither titanium or tungsten are resistive materials and therefore, many desired resistive properties are absent.

Accordingly, it would be highly desirable to have a process for fabricating resistive conductive patterns on aluminum nitride substrates which overcomes the limitations of the prior art.

SUMMARY OF THE INVENTION

A method of fabricating a resistive adhesion promoting film on an aluminum nitride substrate includes providing an aluminum nitride substrate and then forming a resistive chromium containing film thereon. A refractory metal layer is then formed on the resistive film. Once the refractory metal layer has been formed, both the refractory metal layer and the resistive film are patterned as desired. One or more conductive layers may then be formed on the patterned refractory metal layer to serve as a conductive pattern to which a semiconductor die may be electrically coupled. Resistors may be formed between the lines of the conductive pattern. The resistors are formed from the resistive film.

BRIEF DESCRIPTION OF THE DRAWING

The single figure is a highly enlarged plan view of a semiconductor die disposed on an aluminum nitride substrate having a conductive pattern thereon.

DETAILED DESCRIPTION OF THE DRAWING

The single figure is a highly enlarged top view of a portion of a semiconductor package 10. Semiconductor package 10 comprises an aluminum nitride substrate 12 having a semiconductor die 14 disposed thereon. Also depicted are conductive lines 16 patterned on substrate 12 and thin film resistors 18 disposed between various conductive lines 16.

The portion of semiconductor package 10 depicted is typically a portion of a high frequency package such as an RF package. Substrate 12 would typically be mounted on a metal header or heat sink having leads extending therefrom. Conductive lines 16 would be electrically coupled to the leads, typically by wire bonds. Conductive lines 16, in turn, would be electrically coupled to semiconductor die 14. Once the entire semiconductor package was assembled, a cap would be placed over substrate 12 including semiconductor die 14, conductive lines 16 and resistors 18.

Aluminum nitride is a very desirable material to use for substrate 12 in high frequency packages. Aluminum nitride has desireable thermal conductivity properties that are necessary for this type of package. Moreover, aluminum nitride is relatively inexpensive, easy to work with and is not toxic or hazardous. However, aluminum nitride generally adheres poorly to metals unless various thick film or reactive sputtering processes were utilized.

The fabrication of the portion of semiconductor package 10 depicted by the figure is as follows. Initially, aluminum, nitride substrate 12 is provided. Aluminum nitride substrate 12 is cleaned so that no impurities remain on its surface. A typical cleaning process will include washing substrate 12 in acetone and then performing a spin-rinse dry in DI water. Following the spin-rinse dry, substrate 12 is baked at 300 degrees centigrade for 30 minutes. This bake allows substrate 12 to dry completely.

A resistive chromium containing film is formed on aluminum nitride substrate 12 following cleaning. A preferred film is chromium silicon monoxide (CrSiO). A chromium silicon monoxide film may be RF sputtered onto substrate 12 in an argon atmosphere. This is well known in the art Preferably, the target employed to deposit the chromium silicon monoxide is 90% chromium and 10% silicon monoxide. The chromium silicon monoxide film should have a thickness of less than 1500 angstroms and preferably, a thickness on the order of 300 to 600 angstroms. Even more preferably, a thickness of 400 to 500 angstroms should be obtained. It is desirable that the chromium silicon monoxide film have a sheet resistivity on the order of 100 to 150 ohms/square and optimally, a sheet resistivity of 127 ohms/square. It should be understood that the sheet resistivity of the chromium silicon monoxide film may vary depending upon specific applications. Chromium silicon monoxide has excellent adhesion to aluminum nitride substrate 12. When chromium silicon monoxide is deposited on aluminum nitride, it deposits as $Cr_2O_3$-Si. In other words, the adhesion to the aluminum nitride surface is excellent because an alumina oxy-nitride is formed. The resistive chromium containing film allows the formation of thin film resistors 18 directly on substrate 12. Resistors 18 are highly desirable in high frequency semiconductor packages such as package 10 in order to achieve desired electrical performance.

Following the formation of the resistive chromium containing film, a refractory metal layer is formed on the resistive film. The refractory metal layer preferably comprises gold although other refractory metals may be employed. The refractory metal layer preferably has a thickness on the order of 200 to 2000 angstroms and most preferably on the order of 1000 angstroms. It is desireable that the refractory metal layer is deposited on the resistive film without breaking the vacuum under which the resistive film was deposited. This avoids contamination problems which might otherwise be encountered. The refractory metal layer serves as an adhesion promoting layer for conductive layers which will be explained presently. It should, however, be understood that the refractory metal layer disposed on the resistive film may be employed as alone as conductive lines 16.

Following the formation of the refractory metal layer, the refractory metal layer and the resistive film are both patterned with photoresist to define the pattern of conductive lines 16. Next, one or more conductive layers are formed on the patterned refractory metal layer. Preferably, the one or more conductive layers comprise a metal or metal scheme. In a preferred embodiment, a copper layer is formed on the refractory metal layer, a nickel layer is formed on the copper layer and a gold layer is formed on the nickel layer. These conductive layers are preferably plated on the patterned refractory metal layer. It should be understood that during plating, no metal will plate on the aluminum nitride substrate because of the photoresist pattern and plating will occur only on the patterned portion of the refractory metal layer. Although metal conductive layers are described herein, it should be understood that other conductive materials may also be employed. It should be understood that conductive lines 16 comprise the resistive film, refractory metal layer, and conductive layers as patterned.

Following the formation of conductive lines 16, resistors 18 are defined. After removing the photoresist layer used to pattern conductive lines 16, a second photoresist pattern is utilized to define resistors 18. The portions of the refractory metal and resistive layers not patterned or plated are completely removed so that substrate 12 is exposed where no conductive lines 16 or resistors 18 are to be formed. The second photoresist layer is now removed and the portions of the refractory metal layer disposed on resistor patterns 18 are removed to leave resistors 18 comprising the chromium containing film. Resistors 18 may be fabricated to have desired values depending upon their size and the sheet resistance of the resistive film. Further, resistors 18 may be laser trimmed to specific values.

Next, semiconductor die 14 is attached to aluminum nitride substrate 12 and electrically coupled to conductive lines 16. Semiconductor die 14 may be attached by a non-conductive die attach material and then wire bonded to conductive lines 16. Conversely, bond pads or the like disposed on the backside of semiconductor die 14 may be directly coupled to conductive lines 16. Ball bond technology and the like enabling this kind of electrical coupling is well known in the art.

The invention described herein allows for conductive lines 16 and resistors 18 to be fabricated on an aluminum nitride substrate 12. The chromium containing resistive film further adheres extremely well to aluminum nitride substrate 12. The refractory metal layer adheres very well to the resistive film and allows additional conductive layers to be formed thereon which will adhere to the refractory metal layer. Further the formation of the refractory metal layer allows plating of additional metal conductive layers thereon. The kind of package disclosed herein is extremely useful for high frequency applications such as RF device packages.

Thus it is apparent that there has been provided, in accordance with the invention, a method of fabricating resistive conductive patterns on aluminum nitride substrates. Which specific embodiments of the invention have been shown and described, further modifications and improvements will occur to those of skill in the art. It is desired that it be understood, therefore, that this invention is not limited to the particular forms shown and it is intended in the appended claims to cover all modifications which do not depart from the spirit and scope of this invention.

What is claimed is:

1. A method of fabricating a semiconductor package having a resistive adhesion promoting film and thin film resistors on an aluminum nitride substrate comprising the steps of:
   providing an aluminum nitride substrate;
   forming a resistive chromium containing film on said substrate;
   forming a refractory metal layer on said resistive film; and
   defining resistors from said resistive chromium containing film.

2. The method of claim 1 wherein the forming a resistive film step comprises forming a chromium silicon monoxide film.

3. The method of claim 2 wherein the forming a resistive film step comprises forming a film having a thickness less than 1500 angstroms.

4. The method of claim 3 wherein the forming a resistive film step comprises forming a film having a thickness on the order of 300 to 600 angstroms and a sheet resistance on the order of 100 to 150 ohms/square.

5. The method of claim 1 wherein the forming a refractory metal layer step comprises forming a gold layer.

6. The method of claim 5 wherein the forming a refractory metal layer step comprises forming a layer having a thickness between 200 and 2000 angstroms.

7. The method of claim 6 wherein the forming a refractory metal layer step comprises forming a layer having a thickness on the order of 1000 angstroms.

8. The method of claim 1 further comprising the step of cleaning the substrate prior to the forming a resistive film step.

9. The method of claim 1 further including the step of patterning conductive lines from the resitive film and the refractory metal layer.

10. The method of claim 9 further including the step of forming resistors between conductive lines, said resistors being formed from the resistive film.

11. A method of fabricating a semiconductor package having a conductive pattern and thin film resistors on an aluminum nitride substrate comprising the steps of:
 providing an aluminum nitride substrate;
 forming a resistive chromium containing film on said substrate;
 forming a refractory metal layer on said resistive film;
 patterning said resistive film and said refractory metal layer;
 forming one or more conductive layers on said patterned refractory metal layer; and
 defining resistors from said resistive chromium containing film.

12. The method of claim 11 wherein the forming a resistive film step comprises forming a chromium silicon monoxide film.

13. The method of claim 12 wherein the forming a resistive film step comprises forming a film having a thickness less than 1500 angstroms.

14. The method of claim 13 wherein the forming a resistive film step comprises forming a film having a thickness on the order of 300 to 600 angstroms and a sheet resistance on the order of 100 to 150 ohms/square.

15. The method of claim 11 wherein the forming a refractory metal layer step comprises forming a gold layer.

16. The method of claim 15 wherein the forming a refractory metal layer step comprises forming a layer having a thickness on the order of 200 to 2000 angstroms.

17. The method of claim 16 wherein the forming a refractory metal layer step comprises forming a layer having a thickness on the order of 1000 angstroms.

18. The method of claim 11 wherein the forming one or more conductive layers step comprises forming copper, nickel and gold layers.

19. The method of claim 11 further comprising the step of cleaning the substrate prior to the forming a resistive film step.

20. The method of claim 11 wherein a semiconductor die is disposed on said substrate and electrically coupled to the one or more conductive layers.

21. The method of claim 11 further including the step of forming resistors between the patterned layers, said resistors being formed from the resistive film.

22. A method of fabricating a semiconductor device on an aluminum nitride substrate comprising the steps of:
 providing an aluminum nitride substrate;
 cleaning said substrate;
 forming a resistive chromium silicon monoxide layer having a thickness of less than 1500 angstroms on said substrate;
 forming a gold layer having a thickness on the order of 200 to 2000 angstroms on said resistive layer;
 patterning said resistive and gold layers;
 forming one or more conductive layers on said gold layer;
 forming resistors between said patterned layers from said resistive layer; and
 disposing a semiconductor die on said substrate and electrically coupling said die to said one or more conductive layers.

23. The method of claim 22 wherein the forming a resistive layer step comprises forming a layer having a thickness on the order of 300 to 600 angstroms and a sheet resistance on the order of 100 to 150 ohms/square.

24. The method of claim 23 wherein the forming a gold layer step comprises forming a layer having a thickness on the order of 1000 angstroms.

25. The method of claim 23 wherein the forming one or more conductive layers step comprises forming copper, nickel and gold layers.

* * * * *